(12) United States Patent
Wiedemann et al.

(10) Patent No.: US 7,985,465 B2
(45) Date of Patent: Jul. 26, 2011

(54) POLYVINYL ACETAL-CONTAINING FILM

(75) Inventors: Frank Wiedemann, Troisdorf (DE); Andreas Karpinski, Odenthal (DE)

(73) Assignee: Kuraray Europe GmbH, Frankfurt (DE)

( * ) Notice: Subject to any disclaimer, the term of this patent is extended or adjusted under 35 U.S.C. 154(b) by 1169 days.

(21) Appl. No.: 11/636,714

(22) Filed: Dec. 11, 2006

(65) Prior Publication Data

US 2007/0148419 A1 Jun. 28, 2007

(30) Foreign Application Priority Data

Dec. 9, 2005 (EP) ..................................... 05111930

(51) Int. Cl.
*B32B 7/02* (2006.01)
(52) U.S. Cl. ........................ 428/212; 428/192; 428/198
(58) Field of Classification Search .................. 428/192, 428/198, 212
See application file for complete search history.

(56) References Cited

FOREIGN PATENT DOCUMENTS

| | | |
|---|---|---|
| DE | 101 43 109 | 3/2003 |
| EP | 0 185 863 | 7/1986 |
| EP | 1 181 258 | 2/2002 |
| EP | 1 235 683 | 9/2002 |
| WO | 01/43963 | 6/2001 |
| WO | 02/40578 | 5/2002 |
| WO | 03/097347 | 11/2003 |
| WO | 2005/070651 | 8/2005 |
| WO | WO2005070651 | * 8/2005 |

* cited by examiner

*Primary Examiner* — David R Sample
*Assistant Examiner* — Lawrence D Ferguson
(74) *Attorney, Agent, or Firm* — Millen, White, Zelano & Branigan, P.C.

(57) ABSTRACT

The invention relates to a film based on plasticizer-containing polyvinyl acetals having improved uniformity of length variations over the width of the film for manufacturing laminated glazing and its use in laminated glazing or solar modules.

Figure 1:
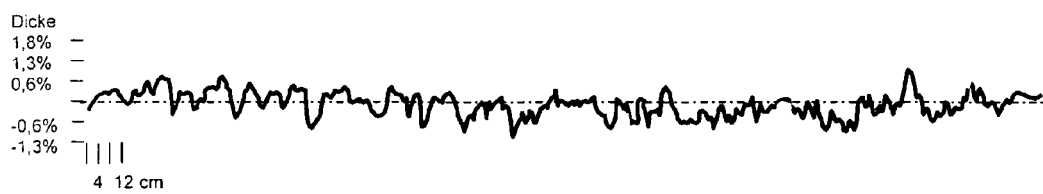

23 Claims, 3 Drawing Sheets a    b a  b

Fig. 6
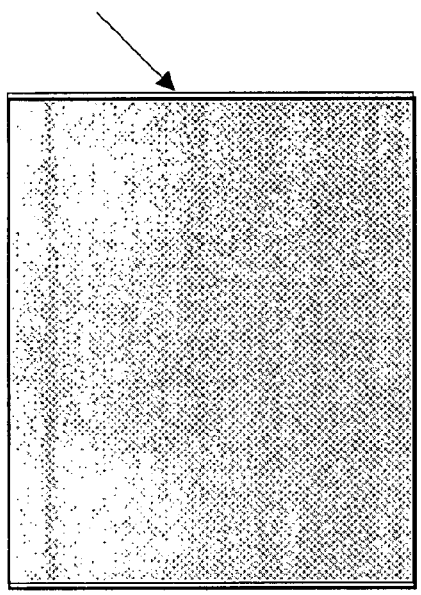

POLYVINYL ACETAL-CONTAINING FILM

The present invention relates to a film based on plasticizer-containing polyvinyl acetal having improved uniformity of length variations over the width of the film and to laminated glazing produced with the film.

TECHNICAL FIELD OF THE INVENTION

Films based on plasticizer-containing polyvinyl acetals, generally polyvinyl butyral (PVB), have been used in the manufacture of laminated glazing for a long time. In this process, the film is laid on a first glass pane, covered with the second glass pane and subsequently pressed to a pre-laminate by means of rolls or similar. During the manufacture of the laminate, the film is laid on the lower covering glass with an overhang of a few millimeters. Subsequent to applying the film, the upper covering glass is laid on and the excess film is then cut off. This trimming can be carried out manually or mechanically. Depending on the technology, the film is cut flush with the glass edge or a defined overhang of a few millimeters is left over. In order to obtain a uniform laminate edge, it is necessary for the film edge to run parallel to the glass edge during the entire pre-lamination process.

In practice, interlayer films for such laminated glazing are produced exclusively by continuous extrusion of a plasticizer-containing polyvinyl acetal mass. This process results in a so-called "neck-in" of the extruded film, i.e. a crosswise coalescence of the mass in the border region, which leads to increased shrinkage at the film margins. The result of this shrinkage is that the rear and front transverse edge of the film is subjected to length variations of varying magnitude over the width of the film during the pre-lamination process, which leads to the transverse edges no longer running parallel to the glass edge.

If such a film finishes flush with the glass edge immediately after the trimming, hollow spaces with no film in the border region of the laminated glazing are obtained during the lamination process. As a result, it is generally not possible to utilize the entire laminate area, and the transverse edges have to be cut back first. In the worst case, it may come to glass breakage at the hollow spaces in the pre-lamination oven.

If such a film overhangs the glass edge immediately after the trimming, it shrinks up to the glass edge at the border region during the lamination process, but still overhangs in the center region. In this case, there are no hollow spaces and the transverse edges must be cleaned in order to utilize the laminate without losses. In the worst case, it may come to contamination of the rolls by overhanging film in the pre-lamination oven or to bonding of the laminates in the autoclave, which may lead to glass breakage.

Insufficient parallelism of the transverse edges is caused, among other reasons, by different longitudinal stress conditions of the film over its width, which leads to a shortening of the film in the regions with high stress during the relaxation process subsequent to the application and trimming. Especially when this shortening occurs in the border region, this leads to sickle-shaped transverse edges.

The effect of strong peripheral stress is often only visible for larger pane formats, e.g. from 2×2 m. Parallelism of the transverse edges is particularly affected in laminated glazing of approx. 3×6 m, which is currently the largest size in the glass industry.

It is known that films having a uniform thickness profile, i.e. the outer edges of the film have the same thickness as the central region, show a tendency to greater stress on the outer edges. With reference to this problem area, WO 2005/070651 A1 describes the production of PVB films having a greater thickness at the edge regions of the film. A standard film thickness of 0.38 mm and a thickness of 0.4 mm at the edge region of the film are proposed therein. This publication does not further specify the edge region of increased thickness. In addition, the proposed increased film thickness at the edge is large compared to the standard thickness of 0.38 mm, which may lead to increased air entrapment during the lamination process.

Object

It was therefore the object of the present invention to provide films having uniform length variation over the width of the film.

Surprisingly, it was found that films having slight edge flaring in a defined edge region have better uniformity of the length variations over the width of the film than films having uniform thickness.

DISCLOSURE OF THE INVENTION

The present invention therefore relates to a film based on plasticizer-containing polyvinyl acetals having improved uniformity of length variations over the width of the film, characterized in that the film having a minimum width of 100 cm has a thickness at the border regions of up to 20 cm from the film edge, which is increased by 0.1 to 4.5% in relation to the mean value of the thickness of the remaining film regions (and film center, respectively).

Compared to WO 2005/070651, it was found that the length variation is not improved with increased edge thickness. It appeared that the slight edge thickening according to the invention of 0.1 to 4.5% is sufficient to achieve the desired effect and, at the same time, avert negative effects, such as air entrapment, on the lamination process.

Films according to the invention are preferably produced by extrusion with a minimum width of 90 cm, 100 cm, 200 cm, 250 cm or 300 cm. The films according to the invention are particularly preferably produced in the current maximum width for the glass processing industry of 321 cm (i.e. 310 cm to 330 cm).

The minimum film length is 200 cm, it can, however, amount to 10 m, 50 m 100 m, 200 m, 500 m, 1000 m or 2000 m in the direction of extrusion.

Preferably, only the two edge regions of the films according to the invention which lie in longitudinal direction and in the direction of extrusion, respectively, have an increased thickness. The increased thickness of the films in the edge region can also be smaller, such as e.g. 0.9 to 2.8% in relation to the mean value of the thickness of the remaining film regions.

The edge regions in which the film according to the invention has an increased thickness can be up to 20 cm (measured from the edge of the film) wide. It is possible to reduce the variation in thickness in an edge region of up to 15 cm (measured from the edge of the film), or up to 10 cm (measured from the edge of the film). Within this region, the thickness of the film varies preferable in a linear manner from the edge region to the centre of the film.

Apart from the edge regions having increased film thickness, reduced thickness fluctuations of the film outside of the edge regions additionally improve the uniformity of the length variations over the width of the films according to the invention. For this reason, outside of the mentioned, thickened edge regions, films according to the invention preferably have differences in thickness of no greater than ±10% relative to the mean value of the thickness of the film in this section. The smaller these thickness fluctuations, the better the uniformity of the variations in length over the width of the film generally is. For this reason, films according to the invention preferably have differences in thickness of no greater than ±5%, no greater than ±3%, thickness of no greater than ±2% and particularly preferably thickness of no greater than ±1.5% outside of the edge regions.

In the regions outside of the edge regions, the films according to the invention have the internationally customary standard thicknesses of interlayer films for laminated glazing of 0.38, 0.76, 1.14, 1.52 or 2.28 mm as average thickness.

Polyvinyl acetal films are usually wound on cylindrical cores for transportation. Films without the edge flaring according to the invention shrink particularly strongly at the edges during winding, so that, instead of being cylindrical, the resulting film roll has a smaller thickness at the edges than in the centre. In contrast, rolls made from the film according to the invention are almost cylindrical or even have a slightly increased thickness at the sides of the roll.

The films according to the invention contain preferably polyvinyl acetals such as polyvinyl butyral, in mixture with one or more plasticizers, such as e.g. dihexyl adipate (DHA) and/or ethylene glycol oligomers such as 3G7 (triethylene glycol heptanoate) or 3G8 (triethylene glycol octanoate). The polyvinyl butyral employed can be used in non-cross-linked form or, as described in DE 101 43 109 A1 or WO 02/40578 A1, in cross-linked form. Particularly preferred non-cross-linked compositions are disclosed e.g. in EP 0 185 863, WO 03/097347 or WO 01/43963 A1.

Films according to the invention can be processed to glass laminates in the conventional manner in vacuum processes, roller processes, laminator processes, microwave processes or autoclave processes (EP 1 235 683 B1 or EP 1 181 258 B1). A further object of the present invention are therefore glass laminates, built up from at least two glass panes with at least one film according to the invention. The laminated glazing preferably consists of two glass panes having an interposed film according to the invention.

The films according to the invention can be used for the manufacture of laminated glazing in the architectural sector or automotive sector. In particular, the manufacture of large area laminated glazing having areas of greater than 2 m² is facilitated by the small change in length according to the invention of the film.

Furthermore, films according to the invention can be used for the manufacture of solar modules. These consist of a transparent covering layer and a back side and at least two films according to the invention, between which the solar cells are disposed. Glass or a transparent weatherproof film such as PTFE, polyvinylidene fluoride or polyvinyl fluoride (Tedlar, DuPont) can be used as covering layer. Glass, PTFE, polyvinylidene fluoride, polyvinyl fluoride, metals or transparent or non-transparent polymers can be used as back side.

EXAMPLES

A plasticizer-containing PVB mixture having the following composition was produced and processed to a film having a width of 321 cm and a mean thickness of 0.76 mm. Composition 75.5% by weight of Mowital B68 (residual acetate content <1%, PVOH content approx. 29%), 24.5% by weight of dihexyl adipate with the stabilizing agents Tinuvin P and BHT. Potassium acetate was used as anti-adhesive agent.

Comparative Example 1

Figure 2:
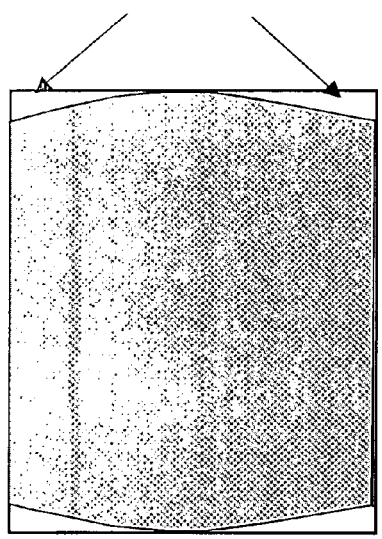
Figure 2:
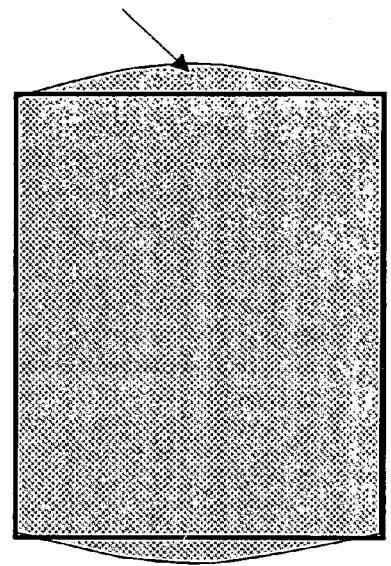

An almost planar film having a thickness profile in accordance with FIG. 1 was produced. Subsequent to producing a pre-laminate using suitably large glass panes, there were observed either hollow spaces in the laminate, as per FIG. 2a, or, rather, overhanging film residues, as per FIG. 2b.

Comparative Example 2

Figure 3:
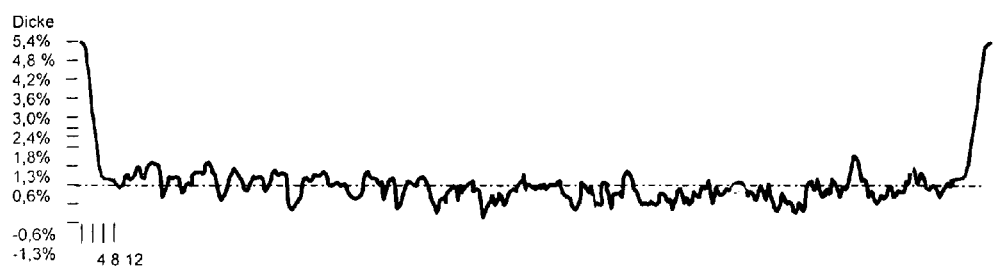
Figure 4:
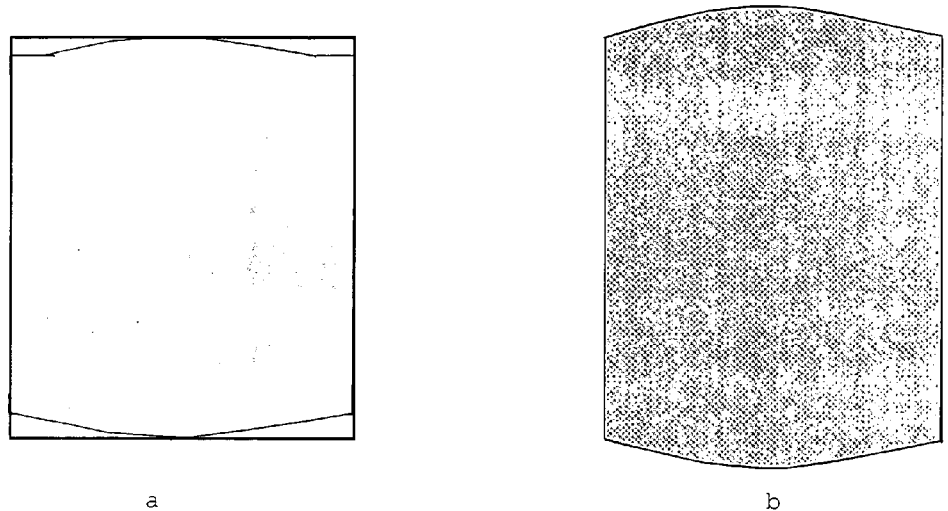
Figure 5:
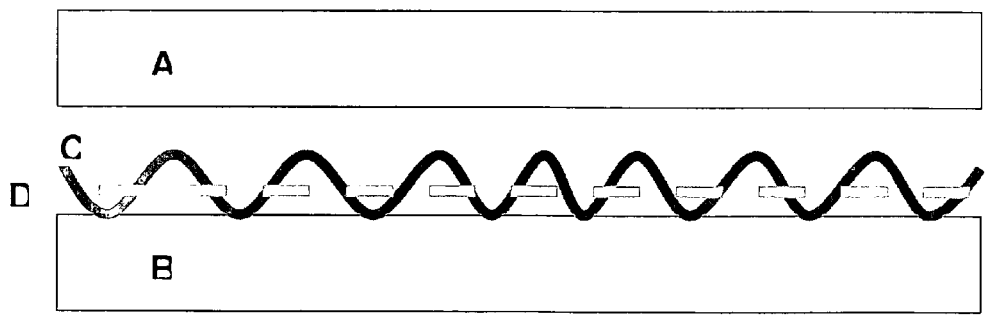

A film having a thickness of 0.38 mm and an edge thickening of more than 5% according to WO 2005/070651 A1 was produced. FIG. 3 shows the thickness profile of the film. Subsequent to producing a pre-laminate using suitably large glass panes, there were observed either hollow spaces in the laminate, as per FIG. 4a, or, rather, overhanging film residues, as per FIG. 4b. Furthermore, the pre-laminate shows a compression in the edge region in the film possible leading to bubbles or optical disturbances. Reason for this could be an uneven tension distribution within the film. FIG. 5 shows the side-view of such pre-laminate, where A stands for the upper cover glass, B for the lower glass, C (continuous line) for the wrinkled edge of the film. D (dotted line) symbolizes the non-wrinkled area of the film in the middle of the pre-laminate (from the observer's eye: behind the wrinkled edge).

Example According the Invention

A film having a thickness profile in accordance with FIG. 6 was produced. The thickness of this film was enlarged by approx. 1.8% in the edge regions (max. 12 cm from the edge). According to FIG. 7, glass laminate produced with this film had film edges which extended parallel to the glass edge.

Film and glass are congruent and can be further processed without further corrections or trimmings.

The invention claimed is:

1. A film based on plasticizer-containing polyvinyl acetals having improved uniformity of length variations over the width of the film, said film having a minimum width of 90 cm, and said film having border regions with a width of up to 20 cm, wherein the thickness of said border regions is increased by 0.1 to 4.5% in relation to the mean value of the thickness of the remaining film regions.

2. The film according to claim 1, wherein said border regions have a thickness increased by 0.9 to 2.8% in relation to the mean value of the thickness of the remaining film regions.

3. The film according to claim 1, wherein said border regions having an increased thickness are in the lengthwise direction of the film.

4. The film according to claim 1, wherein the differences in thickness of the film outside said border regions are not greater than +10% relative to the mean value of the thickness outside said border regions.

5. The film according to claim 1, wherein the film outside said border regions has an average thickness of 0.38, 0.76, 1.14, 1.52, or 2.28 mm.

6. The film according to claim 1, wherein the film has a minimum width of 200 cm.

7. The film according to claim 1, wherein the film has a minimum length of 200 cm.

8. A laminated glazing comprising at least two glass panes and at least one film according to claim 1.

9. A solar module comprising a transparent covering layer, a back side and at least two films according to claim 1, between which the solar cells are disposed.

10. The solar module according to claim 9, wherein said covering layer is made of glass or a transparent, weatherproof film and the back side is made of glass, a transparent or non-transparent polymer or a metal.

11. The film according to claim 1, wherein the width of said border regions is of up to 15 cm.

12. The film according to claim 1, wherein the width of said border regions is of up to 12 cm.

13. The film according to claim 1, wherein the width of said border regions is of up to 10 cm.

14. The film according to claim 1, wherein only two border regions have said increased thickness, and said two border regions are in the longitudinal direction of the film.

15. The film according to claim 1, wherein only two border regions have said increased thickness, and said two border regions are in the direction of extrusion.

16. The film according to claim 1, wherein within said border regions the thickness of the film varies in a linear manner from the edge towards the center of the film.

17. The film according to claim 11, wherein within said border regions the thickness of the film varies in a linear manner from the edge towards the center of the film.

18. The film according to claim 12, wherein within said border regions the thickness of the film varies in a linear manner from the edge towards the center of the film.

19. The film according to claim 13, wherein within said border regions the thickness of the film varies in a linear manner from the edge towards the center of the film.

20. The film according to claim 1, wherein the differences in thickness of the film outside said border regions are not greater than +5% relative to the mean value of the thickness outside said border regions.

21. The film according to claim 1, wherein the differences in thickness of the film outside said border regions are not greater than +3% relative to the mean value of the thickness outside said border regions.

22. The film according to claim 1, wherein said border regions have a thickness increased by 0.9 to 1.8% in relation to the mean value of the thickness of the remaining film regions.

23. The film according to claim 1, wherein said border regions have a thickness increased by 1.8 to 2.8% in relation to the mean value of the thickness of the remaining film regions.

* * * * *